(12) United States Patent
Miyajima et al.

(10) Patent No.: US 6,266,133 B1
(45) Date of Patent: Jul. 24, 2001

(54) STAGE DEVICE, AN EXPOSURE APPARATUS AND A DEVICE MANUFACTURING METHOD USING THE SAME

(75) Inventors: Yoshikazu Miyajima; Tsuneo Takashima; Yukio Takabayashi, all of Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/299,590

(22) Filed: Apr. 27, 1999

(30) Foreign Application Priority Data

May 6, 1998 (JP) .................................. 10-137417

(51) Int. Cl.$^7$ ............................. G03B 27/58; G03B 27/62
(52) U.S. Cl. ............................................. 355/72; 355/75
(58) Field of Search .................. 355/72–77, 53; 318/625, 628; 74/490.09; 310/12–14

(56) References Cited

U.S. PATENT DOCUMENTS

| | | | |
|---|---|---|---|
| 5,334,434 | 8/1994 | Shiota et al. | 428/188 |
| 5,691,806 | * 11/1997 | Tokuda et al. | 355/72 |
| 5,839,324 | * 11/1998 | Hara | 74/490.09 |
| 5,858,587 | * 1/1999 | Yamane et al. | 430/22 |
| 6,002,465 | * 12/1999 | Korenaga | 355/53 |

* cited by examiner

*Primary Examiner*—David M. Gray
*Assistant Examiner*—Hung Henry Nguyen
(74) *Attorney, Agent, or Firm*—Fitzpatrick, Cella, Harper & Scinto

(57) ABSTRACT

A stage device includes a movable body, movable along a guide surface, for moving an element mounted on the movable body, a static pressure bearing, having at least one pad, for guiding the movable body along the guide surface, the at least one pad being attached to the movable body at a first position, and a linear motor, having a movable part and a relatively stationary part, for moving the movable body, the movable part of the linear motor being attached to the movable body at a second position. The movable body has a hollow structure at at least one of the first position and the second position. The hollow structure has an enclosure structure or a rib structure.

17 Claims, 13 Drawing Sheets

FIG.14A  FIG.14B

STAGE DEVICE, AN EXPOSURE APPARATUS AND A DEVICE MANUFACTURING METHOD USING THE SAME

BACKGROUND OF THE INVENTION

1. Field of the Invention

The present invention generally relates to a stage device, an exposure apparatus using the same and a device manufacturing method, wherein the exposure apparatus is preferably used in a lithography process for manufacturing micro-devices.

2. Description of the Related Art

In a lithography process for manufacturing micro-devices (e.g., semiconductors), two types of exposure apparatuses are known. One is a step-and-repeat type (so-called a stepper) and the other is a step-and-scan type (so-called a scanner or a scanning type exposure apparatus).

The former type uses a step-and-repeat sequence for transferring stepwise a pattern of an original (e.g., a reticle or a mask) onto a substrate (e.g., a semiconductor wafer or a glass or silicon substrate). In that sequence, the whole pattern of the original is illuminated and is projected onto one of a plurality of exposure regions on the substrate through a projection optical system, while the original and the substrate are maintained stationary. Next, the substrate is moved stepwise to change the exposure region, and then exposure is repeated in the same manner.

On the other hand, the latter type uses a step-and-scan sequence. In that sequence, an original pattern is illuminated with a slit-like beam and a portion of the pattern is projected onto one of a plurality of exposure regions on a substrate, while both the original and the substrate are scanningly moved. Next, the substrate is moved stepwise to change the exposure region, and then exposure is repeated in the same manner.

The step-and-scan type exposure apparatus seems to have become the mainstream, at least for the near future, for the reason that it has a potential for high exposure performance in terms of an increase in transferring precision and field size.

These types of exposure apparatuses include stage devices (e.g., a wafer stage or a reticle stage) for moving and positioning the wafer or the reticle rapidly. However, when the stage moves with a high rate of acceleration (positive or negative), a reaction of an inertial force occurs and this can cause vibration of not only a base which supports the stage, but also a floor which supports the whole exposure apparatus. This vibration might cause a natural oscillation of the mechanical system of the exposure apparatus and that disturbs the positioning of the stage.

The acceleration of the stage movement has recently been increasing more and more as a result of progress in the throughput (processing speed) in an exposure operation. In the step-and-scan type exposure apparatus, the maximum acceleration has reached as much as 4 G (for the reticle stage) and 1 G (for the wafer stage), for example. Furthermore, due to an increase in the original size and the substrate size, the stage mass has been increasing. For these reasons, a driving force, as defined by the stage mass multiplied by the acceleration, has become enormous, and that means the reaction of the driving force has also become enormous. Consequently, the vibration of the floor as described above has become an actual challenge to be solved.

SUMMARY OF THE INVENTION

In view of above-described recognition about the prior art, a primary object of the present invention is to provide a stage device that is superior to the conventional apparatus.

To improve the conventional apparatus, the inventors propose to apply a hollow structure to a movable portion of the stage device, in order to reduce its mass. Such a hollow structure, however, is apt to produce a resonance itself and is apt to transmit vibrations through itself, for the reason of a lack of rigidity as compared with a structure without a hollow structure. Therefore, we prefer to apply the hollow structure to the stage device with some improvements. Accordingly, another object of the present invention is to provide a stage device having a hollow structure that is consistent with maintaining the stage performance and structural integrity of the stage device.

Yet other objects of the present invention are to provide an improved exposure apparatus using such a stage device, and a method for manufacturing semiconductor devices.

In order to achieve the above objects, the present invention, in a first aspect, provides a stage device including a movable body, movable along a guide surface, for moving an element mounted on the movable body, a static pressure bearing, having at least one pad, for guiding the movable body along the guide surface, the at least one pad being attached to the movable body at a first position, and a linear motor, having a movable part and a relatively stationary part, for moving the movable body, the movable part of the linear motor being attached to the movable body at a second position, wherein the movable body has a hollow structure at at least one of the first position and the second position.

The present invention, in another aspect, provides an exposure apparatus comprising an illumination system for illuminating a substrate with radiation, and a stage device including a chuck for holding the substrate to be exposed, the stage device including a chuck for holding the substrate to be exposed, the stage including a movable body, movable along a guide surface, for moving an element mounted on the movable body, a static pressure bearing, having at least one pad, for guiding the movable body along the guide surface, the at least one pad being attached to the movable body at a first position, and a linear motor, having a movable part and a relatively stationary part, for moving the movable body, the movable part of the linear motor being attached to the movable body at a second position, wherein the movable body has a hollow structure at at least one of the first position and the second position.

The present invention, in still another aspect, provides a device manufacturing method for manufacturing micro-devices, the method comprising illuminating a substrate with radiation, using an illumination system, moving an element mounted on a movable body of a stage device of an exposure apparatus, the movable body being movable along a guide surface, guiding the movable body along the guide surface using a static pressure bearing, having at least one pad, the at least one pad being attached to the movable body at a first position, moving the movable body with a linear motor, having a movable part and a relatively stationary part, the movable part of the linear motor being attached to the movable body at a second position, wherein the movable body has a hollow structure at at least one of the first position and the second position, and exposing the substrate with radiation to manufacture micro-devices.

According to the present invention, since at least a portion of the movable body, where at least one of the pad and the movable part of the linear motor is attached, has a hollow structure, it is possible to improve the performance of the stage device, such as high controllability, reduction of settling time and high positioning accuracy. Hence, the present invention improves performance (e.g., total throughput and exposure accuracy) of the exposure apparatus and increases productivity of the micro-device manufacturing.

These and other objects, features and advantages of the present invention will become more apparent from the following description of the preferred embodiments taken in conjunction with the accompanying drawings.

BRIEF DESCRIPTION OF THE DRAWINGS

FIGS. 14A through 14C are views of a modified chuck, in which FIG. 14A is a plan view, FIG. 14B is an elevational view and FIG. 14C is a cross-sectional view.

DESCRIPTION OF THE PREFERRED EMBODIMENTS

This invention will now be described in detail by way of example with reference to the accompanying drawings.

Figure 1:
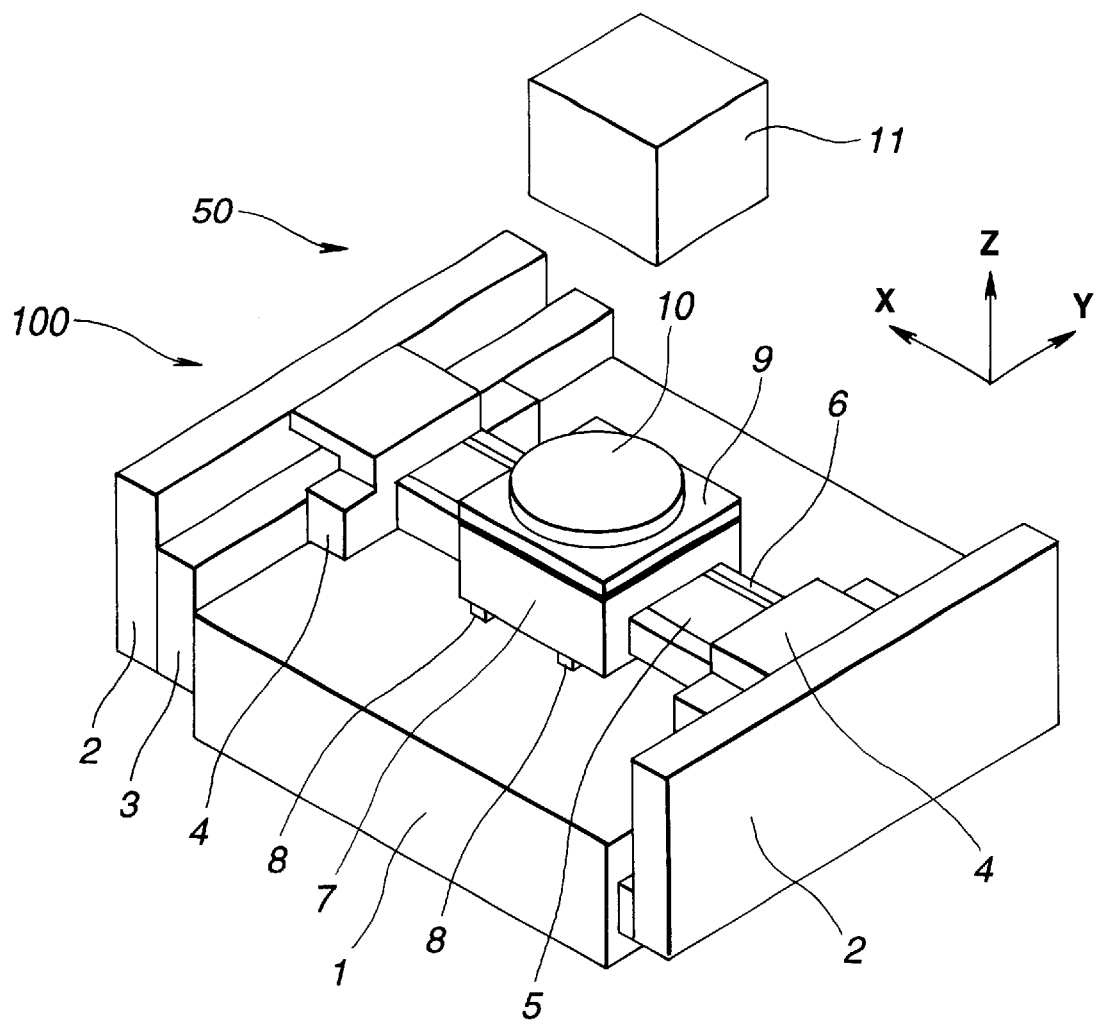
FIG. 1 is a perspective view of a step-and-scan type exposure apparatus including a stage device according to a first embodiment of the present invention.

FIG. 1 illustrates a structure of a step-and-scan type exposure apparatus 50 including a wafer stage device 100 for positioning a wafer as a substrate, according to an embodiment of the present invention. Although this embodiment shows a wafer stage as an example, the present invention is not limited to a wafer stage, but could be applied to a reticle stage in the same manner.

Referring to FIG. 1, the wafer stage device 100 comprises a stationary base 1, a relatively stationary part 2 of a Y-linear motor for driving in the Y-direction, a Y-guide 3 for guiding longitudinally along the Y-direction, a Y-stage 4 for moving in the Y-direction, a relatively stationary part 5 of an X-linear motor for driving in the X-direction, an X-guide 6 for guiding longitudinally along the X-direction, and an X-stage 7 for moving in the X-direction. The stationary part 5 and the X-guide 6 are provided integrally with the Y-stage 4 so that the X-stage 7 is able to move in both the X-direction and the Y-direction.

At the bottom of the X-stage 7, static pressure bearings, including a plurality of gas-pads 8 (e.g., air-pads), are provided so as to lift the X-stage 7 up several micrometers or several tens of micrometers above a surface of the stationary base 1. The stage device 100 further comprises a stage top 9 being movable in the Z-direction and movable precisely in each rotational direction about the X-, Y-, and Z-directions, and a chuck 10 for chucking a wafer (substrate) through vacuum attraction, for example. All of the above-mentioned parts are mainly made of ceramics.

The exposure apparatus 50 further comprises an optical system 11, which is drawn schematically, and includes an illumination optical system, a reticle stage device for holding and moving a reticle, and a projection optical system for projecting a pattern of the reticle onto the wafer held by the chuck 10. While performing pattern transfer, the wafer and the reticle are scanned in the Y direction (scan direction).

Figure 2:
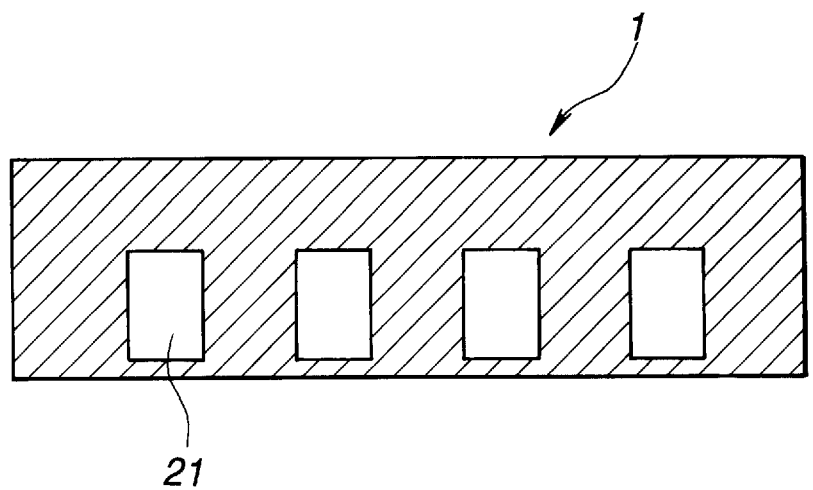
FIG. 2 is a cross-sectional view of the stationary base of the stage device shown in FIG. 1.

FIG. 2 is a cross-sectional view of the stationary base 1. A plurality of hollow portions 21 are provided inside the stationary base 1 as gas tight enclosures (compartments) at a plurality of positions.

Figure 3:
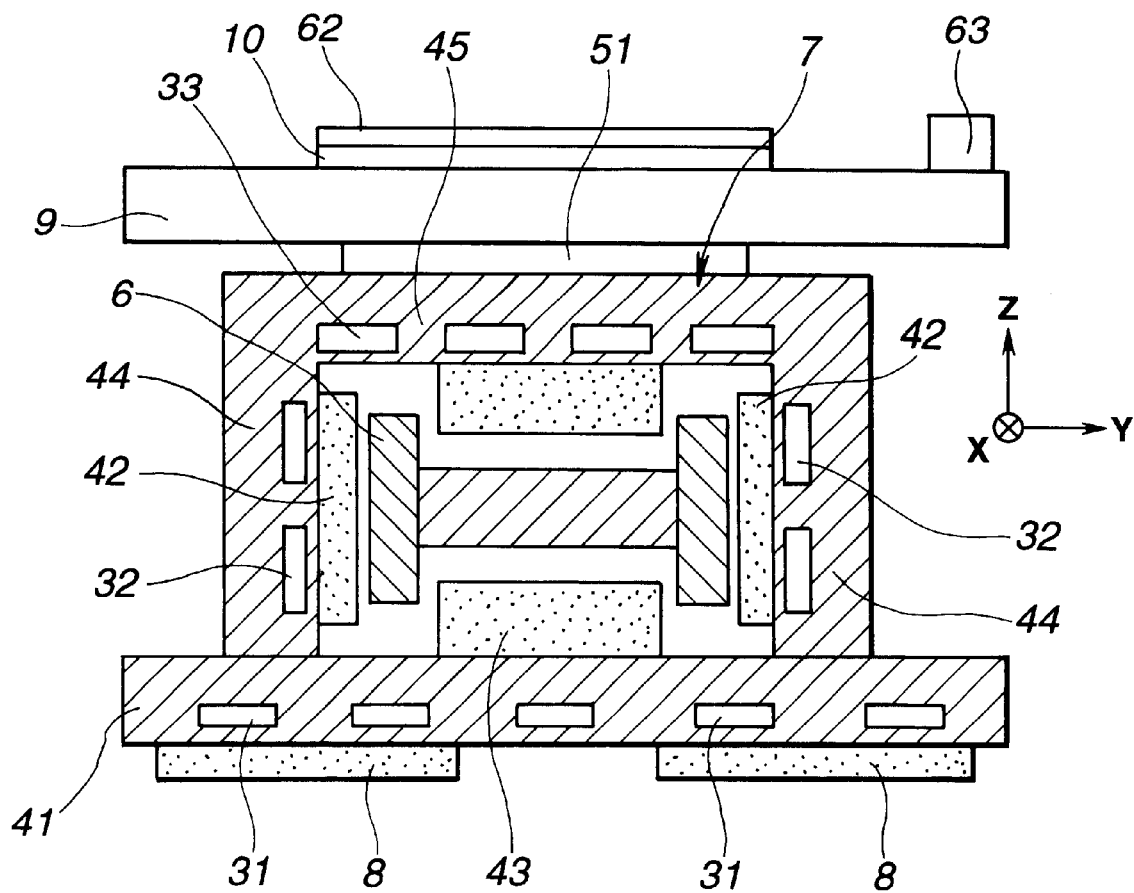
FIG. 3 is a cross-sectional view of the movable units of the stage device shown in FIG. 1.

FIG. 3 is a cross-sectional view of the stage device 100. In FIG. 3, the X-stage 7 includes a stage bottom 41, side walls 44 and a ceiling 45, as a unit. The stage bottom 41 holds the gas-pads 8, and a plurality of hollow portions 31 as gas-tight enclosures are provided inside the stage bottom 41. The side walls 44 of the X-stage 7 hold gas-pads 42 of a static pressure bearing, so as to support the X-stage 7 relative to the X-guide 6 in the Y-direction, and a plurality of hollow portions 32 as gas-tight enclosures are provided inside the side walls 44. The ceiling 45 and the stage bottom 41 of the X-stage 7 hold movable parts 43 of the linear motor, and a plurality of hollow portions 33 as gas-tight enclosures are provided inside the ceiling 45 as well as the stage bottom 41. A radial guide 51 provided on the X-stage 7 movably supports the stage top 9, on which is supported the chuck 10 with a wafer 62 and a bar mirror 63 of an interferometer (not shown).

In this embodiment, the linear motor could be one of two types, a moving-magnet type and a moving-coil type. As the moving-magnet type linear motor, the movable part 43 comprises a permanent magnet and the relatively stationary part 5 comprises a plurality of coils. Conversely, as the moving-coil type, the movable part 43 comprises a coil and the relatively stationary part 5 comprises a plurality of permanent magnets.

Further, in this embodiment, a damping material (or a vibration absorbing material) fills each of the hollow portions 21, 31, 32 and 33, by being injected from an unillustrated small opening formed through each of the respective hollow portions. As the damping material, it is preferable to select a material from rubber, a resin (e.g., urethane foam resin), a viscous liquid, or a powder. Since the stage device 100 according to the present embodiment utilizes damping material filled within the hollow portions of the movable parts (e.g., the X-stage 7, the Y-stage 4), it is possible to suppress resonance produced by the movable parts. Also, since the damping material is filled within the hollow portions of the stationary parts (e.g., the stationary base 1, the Y-guide 3), it is possible to suppress vibration transmitted through the stationary parts. Hence, the present invention achieves effectiveness, such as high controllability, reduction of settling time, and high positioning accuracy. This means an improvement in the performance (e.g., the total throughput, exposure accuracy, etc.) of the exposure apparatus.

Figure 4:
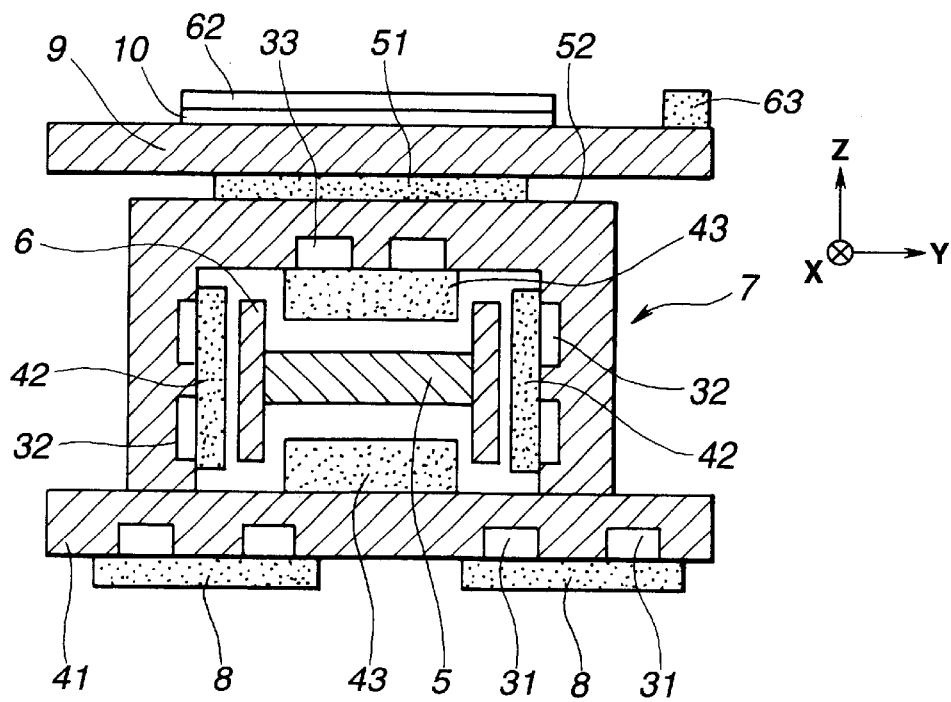
FIG. 4 is a cross-sectional view of a modified embodiment of the stage device shown in FIG. 3.

FIG. 4 illustrates a modification of the above embodiment, in which parts similar to those previously described with reference to FIG. 3 are denoted by the same reference numerals.

Each of the hollow portions 31, 32, 33 is formed as a recess on the side of the stage bottom 41, the side wall and the ceiling of the X-stage 7, respectively, as shown in FIG. 4. And, each hollow portion 31, 32, 33 is enclosed by joining each of the gas-pad 8, the gas-pad 42 and the movable part 43 on the hollow portions, respectively, so as to form a gas-tight enclosure structure.

Figure 5:
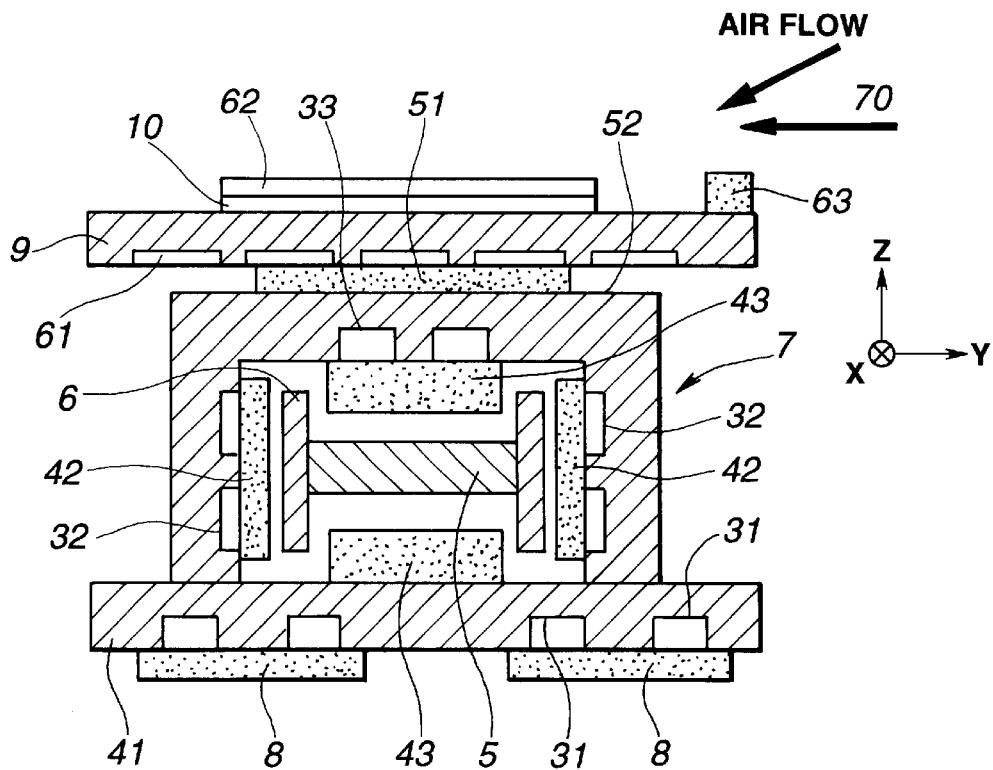
FIG. 5 is a cross-sectional view of another modified embodiment of the stage device shown in FIG. 3.

FIG. 5 illustrates another modified form of the embodiments discussed above, in which parts similar to those previously described with reference to FIG. 3 and FIG. 4 are denoted by the same reference numerals.

The embodiment of FIG. 5 is similar to those shown in FIG. 3 and FIG. 4, with the exception that this embodiment further provides hollow portions 61 as recesses on the bottom surface of the stage top 9. Airflow 70 for controlling temperature around the stage top 9 has a flow direction as shown in FIG. 5. Since the hollow portions 61 are formed on the opposite side of stage top 9 as seen from the flow direction, the hollow portions 61 do not disturb the airflow 70. This prevents a turbulent flow generated around the stage top 9. Also, for reduction of the weight of the stage top 9, it is possible to provide a stage device 100 having high controllability. Accordingly, it is possible to provide a projection exposure apparatus 50 that can readily cope with an increase in throughput and further precision of transfer patterns.

Figure 6:
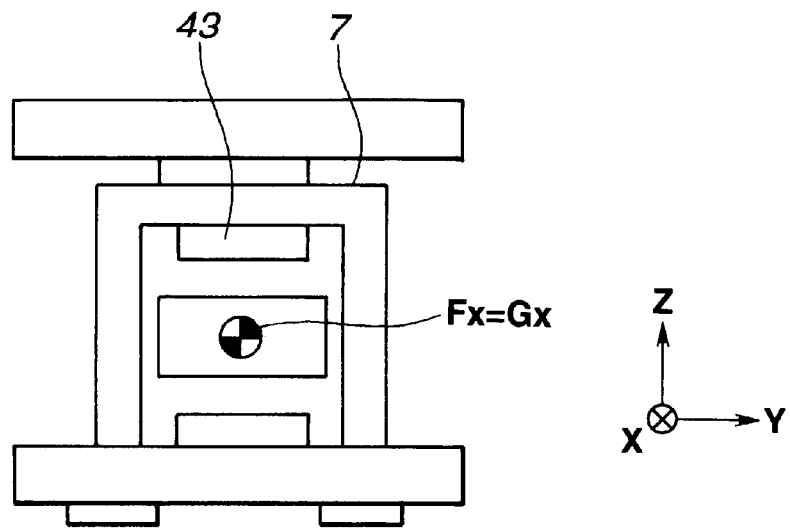
FIG. 6 is a side elevational view taken from the X-direction for explaining the relation between the center of gravity of the stage device and the driving point of the linear motor.

Meanwhile, in the above embodiments, it is preferable that the center of gravity of the stage device 100 and the driving point be substantially of the same height, or the driving point be lower than the center of gravity. In FIG. 6, a mark Gx indicates the center of gravity of the X-movable unit including the X-stage 7, the stage top 9, and the movable part 4 of the X-linear motor, and a mark Fx indicates the driving point of the X-linear motor.

Figure 7:
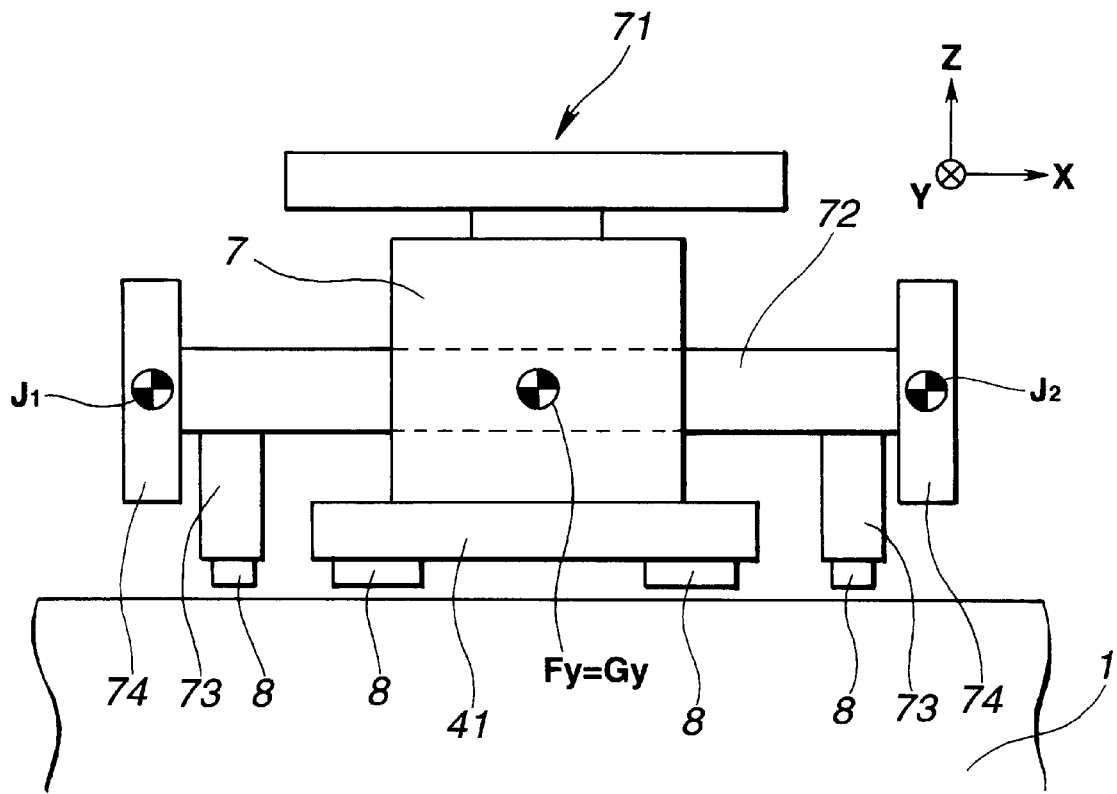
FIG. 7 is a side elevational view taken from the Y-direction for explaining the center of gravity of the stage device and the driving point of the linear motor.

FIG. 6 shows that marks Gx and Fx are the same height, or that mark Fx is lower than mark Gx. By contrast, in FIG. 7, a mark Gy indicates the center of gravity of the Y-movable unit, including the X-movable unit, X-linear motor 72, Y-stage 73 and Y-linear motor 74, when the X-movable unit is positioned at the center of its stroke. A mark Fy indicates the driving point of the Y-linear motor 74, which is a composite of mark $J_1$ (the driving point of the left side of the Y-linear motor) and mark $J_2$ (the driving point of the right side of the Y-linear motor). FIG. 7 shows that marks Gy and Fy are the same height, or that mark Fy is lower than mark Gy.

Figure 8A:
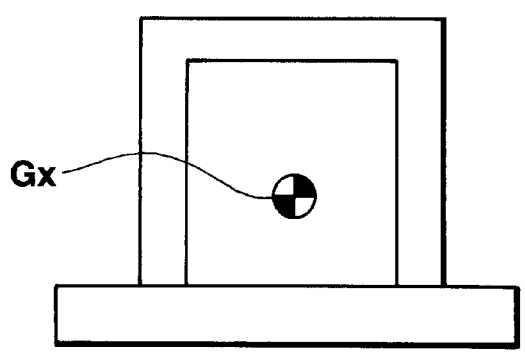
FIGS. 8A through 8C are cross-sectional views for explaining various hollow structures.
Figure 8B:
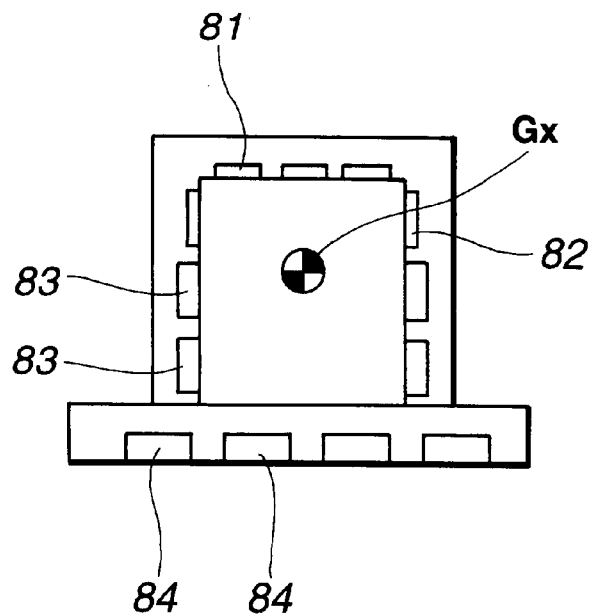
Figure 8C:
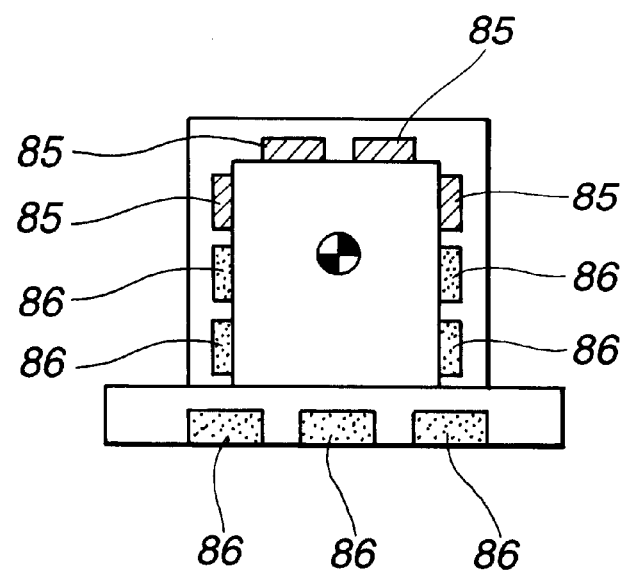

In the meantime, as shown in FIG. 8A, if the stage movable unit were made as a non-hollow member, the center of gravity Gx of X-movable unit 71 would usually be located lower than the central height of the unit 71. FIG. 8B and FIG. 8C show some ways to locate the center of gravity Gx higher than that as shown in FIG. 8A. In FIG. 8B, hollow portions 81 and 82, which are positioned relatively high, have a relatively small enclosure size as compared to that of the hollow portion 83, which is positioned lower. Also, the hollow portion 84, which is positioned lowest, has the largest enclosure size. In FIG. 8C, which shows another example, the hollow portions 85, which are positioned relatively high, utilize relatively light material (e.g., having a small specific gravity) in their hollow portions as compared with that used in the hollow portions 86, which are positioned lower than hollow portions 85.

Figure 9:
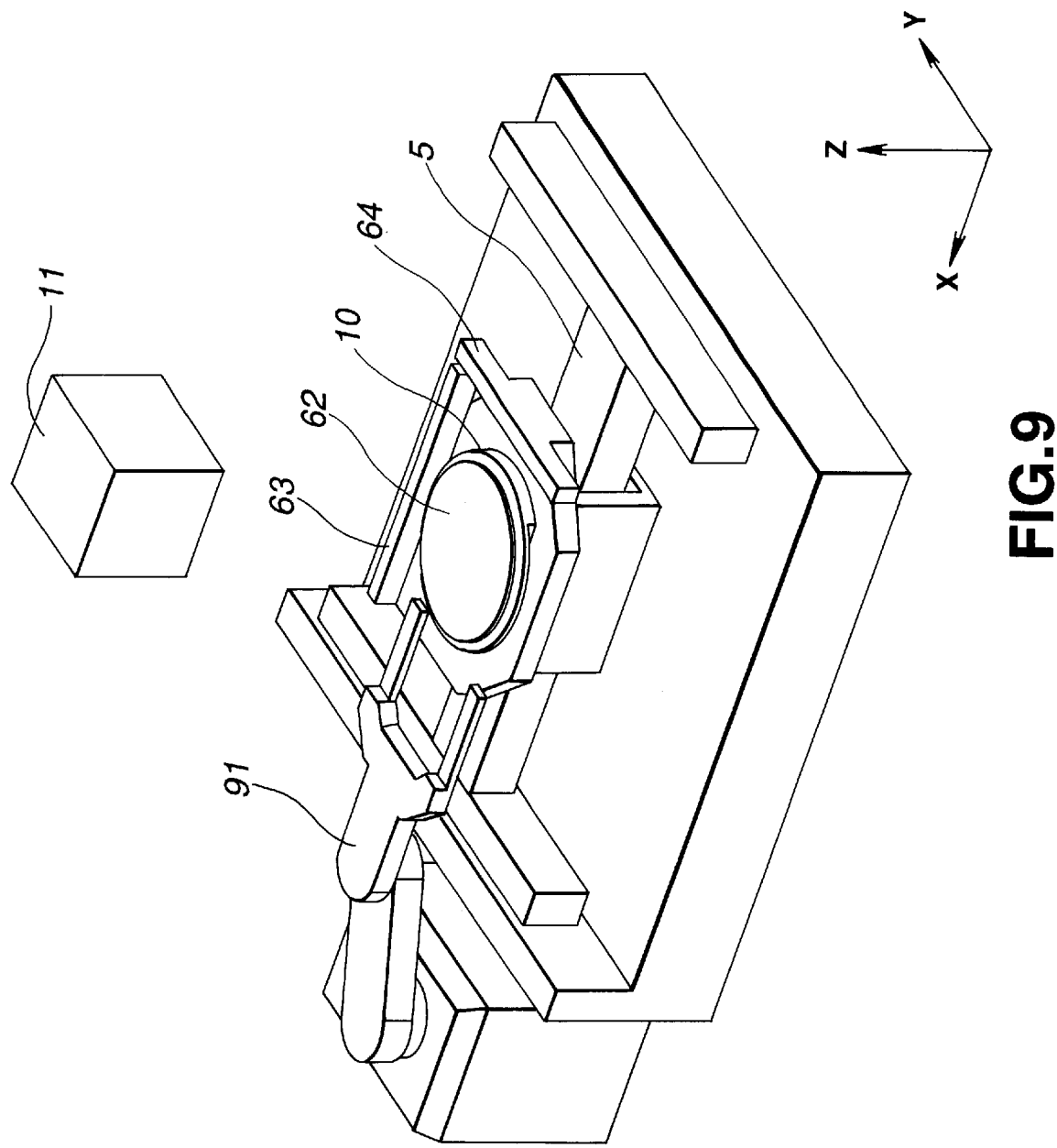
FIG. 9 is an exploded view of another embodiment of the invention.
Figure 10:
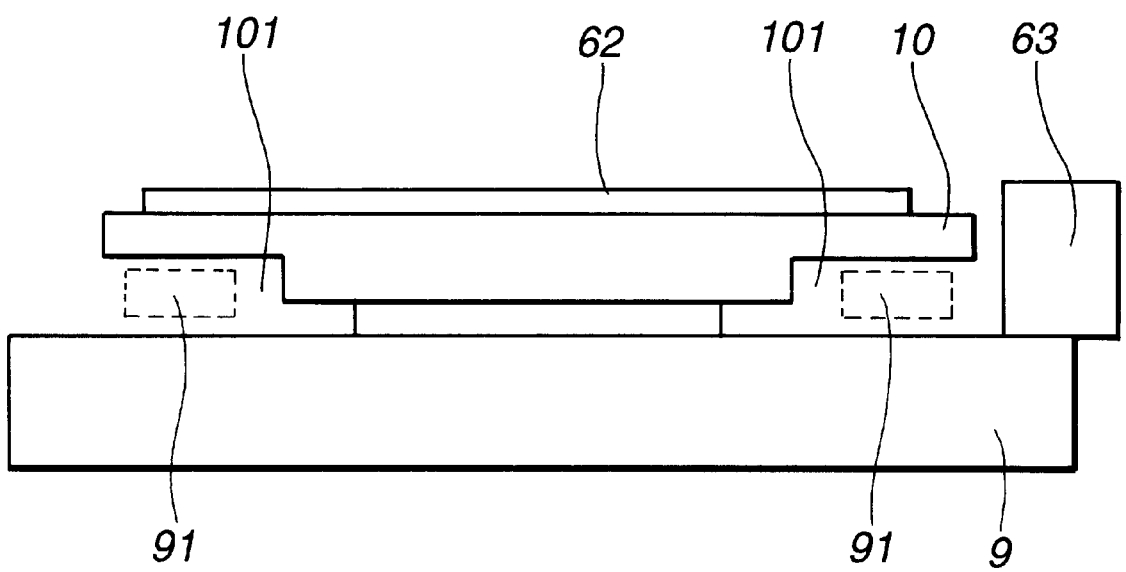
FIG. 10 is an elevational view of the chuck shown in the embodiment of FIG. 9.
Figure 12:
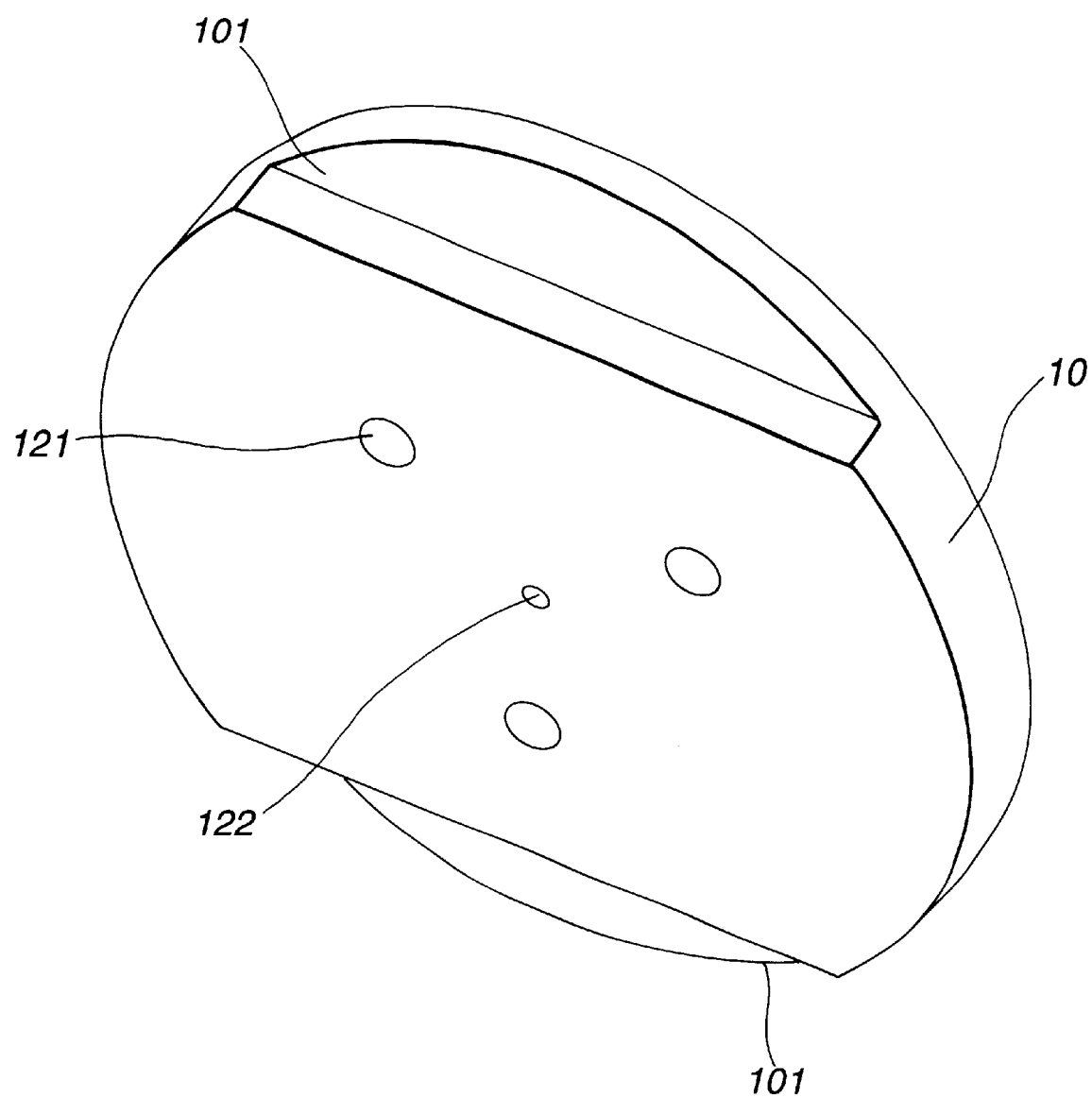
FIG. 12 is an exploded view of the chuck shown in the embodiment of FIG. 9, as seen from its bottom.

FIG. 9, FIG. 10 and FIG. 12 illustrate embodiments of the invention, in which parts similar to those previously described with reference to FIG. 1 to FIG. 8 are denoted by the same reference numerals. FIG. 9 illustrates a structure of a wafer stage device 100 for a step-and-scan type exposure apparatus, FIG. 10 illustrates a side view of the wafer chuck 10 used in the wafer stage 100, and FIG. 12 illustrates a view of the chuck 10 from its bottom.

In FIG. 9, a robotic arm 91 having a fork-like hand is provided for detaching the chuck 10 from and for attaching the chuck 10 on the stage top 9. A bar mirror 63 extending along the X-direction and a bar mirror 64 extending along the Y-direction are used for interferometers. While pattern transfer is performed, the wafer and the reticle are scanned in the Y-direction (i.e., the scan direction).

As shown in FIG. 10, hollow portions 101 (i.e., recesses) are formed in two positions on the bottom of the chuck 10. As shown in FIG. 12, three holes 121 for lift pins and a vacuum hole 122 are provided through the chuck 10.

As shown in FIG. 10, the chuck 10 is replaceable for its cleaning by using the robotic arm 91. In this process, the robotic arm 91 inserts its hand into the two gaps, which are formed by the recesses 101, between the stage top 9 and the chuck 10, and lifts the chuck 10 up to detach it from the stage top 9. The chuck 10 must have a thickness sufficient to have enough rigidity for causing the wafer 62 to conform its shape to a holding surface of the chuck 10.

Figure 11:
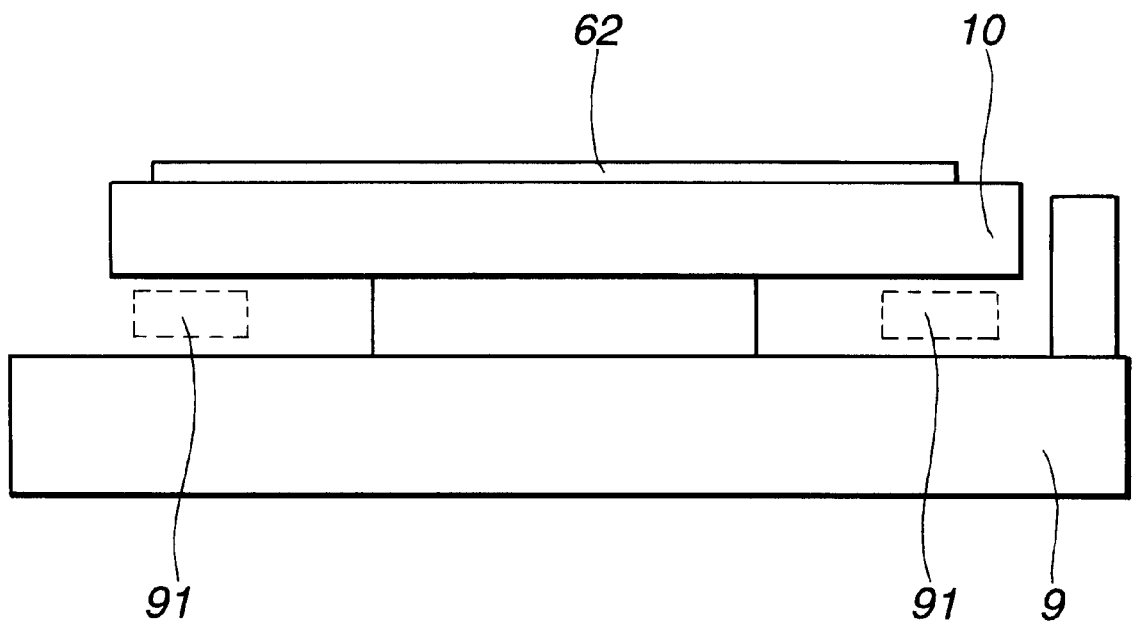
FIG. 11 is an elevational view of a conventional structure for discussion purposes, with respect to the embodiment shown in FIG. 10.

FIG. 11 illustrates a conventional structure for discussion purposes, with respect to the embodiment shown in FIG. 10. The conventional structure dose not have hollow portions (recesses) on the chuck 10. Accordingly, in this structure, it is necessary to provide a large gap between the stage top 9 and the chuck 10 for allowing the hand of the robotic arm 91 to enter the gap. As a result of this structure, the center of gravity of the chuck 10, i.e., the stage device 100 becomes higher than that of the structure as illustrated in FIG. 10.

By contrast, in the embodiment shown in FIG. 10, it is possible to put the chuck 10 close to the stage top 9 while having enough space for the robotic arm 91. Particularly, the chuck 10 has two hollow portions (recesses) 101 on the bottom of it for receiving the robotic arm 91. Both hollow portions 101 extend along the X-direction, which is perpendicular to the Y-direction (scan direction), and the hand of robotic arm 91 is inserted from the X-direction.

According to this embodiment, it is possible to allow the center of gravity of the stage movable parts to be lower and closer to the stage driving position. This reduces an inertial moment and improves dynamic behavior of the stage control In addition, since the position of the wafer (i.e., an image surface) can become lower, the bar mirrors 63, 64 also can be become lower in height and more lightweight. Consequently, it is possible to reduce unevenness above the stage top 9 and to reduce turbulent airflow for controlling temperature around the stage device 100.

Figure 13:
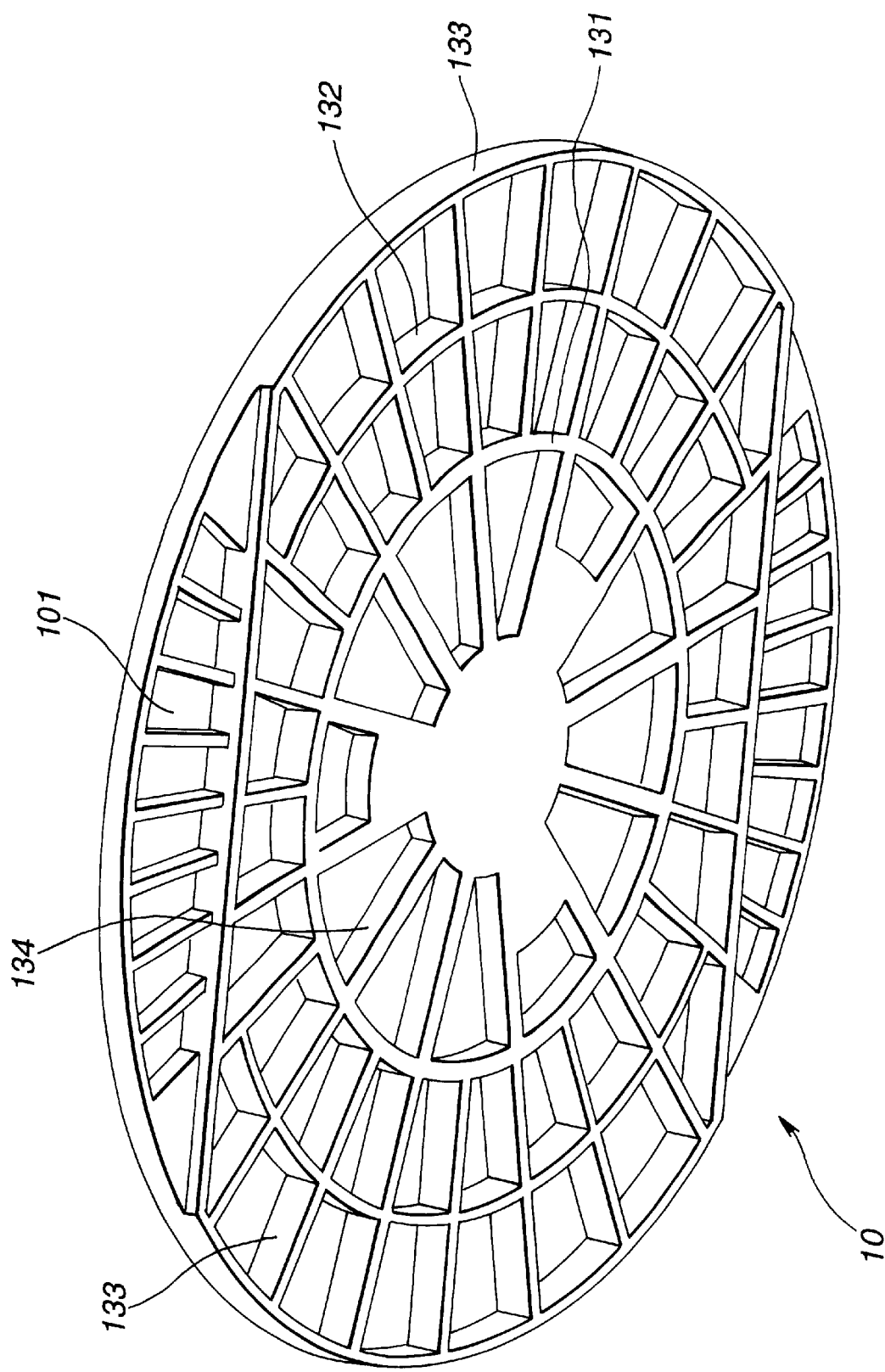
FIG. 13 is an enlarged view of a modified embodiment of the chuck shown in FIG. 12.

FIG. 13 illustrates a modified embodiment of the chuck 10 shown in FIG. 12, and is a view of the chuck 10 from its bottom. The bottom of the chuck 10, made of a ceramic material, consists of a rib-structure having concentric ribs 131, 132, 133 and radial ribs 134, 135, and these ribs form hollow portions. Also, two hollow portions (recesses) 101 are formed for the robotic arm 91. The rib-structure, however, is not limited to the above shape. For example, a polygon rib such as a lattice structure or a honey-comb structure can be chosen.

As a result of the foregoing structure, the chuck 10 is relatively lightweight, with enough stiffness for causing the wafer to conform to desired shapes. In particular, the chuck 10 has a round shape for being fitted to the wafer shape. The wafer, which generally has a slight deformation, is reformed to be flat, with a flatness of under about 1 micrometer, by holding the wafer onto the chuck 10 using vacuum pressure. A typical wafer has a slight deformation, of about 100 micrometers, which is caused during the semiconductor manufacturing process. This deformation is basically a bowl shape or a saddle shape, which can be represented by a quadratic or a cubic equation, and further higher-order deformation might be added. Therefore, the chuck 10 preferably has the ability to reform a quartic or a quintic deformation of the wafer. Also, the minimum demand of the degree of flatness of the wafer after the reforming is under 0.5 micrometer. This means that it is necessary to decrease the deformation by a factor of 200 in the reforming process.

To achieve such a demand, the minimum thickness of the chuck 10 is denoted by the expression below, assuming that the chuck is a solid member:

$$(Ec\ tc^3)/(Ew\ tw^3) > n$$

(Ew: Young's modulus of the wafer, tw: wafer thickness, Ec: Young's modulus of the chuck, tc: chuck thickness, 1/n: target deforming factor).

To apply the rib structure to the bottom of the chuck 10, as in this embodiment, is effective in reducing the thickness of the chuck tc as defined by the above expression.

Furthermore, in this embodiment, a gap between adjacent ribs in the radial direction is nearly equal to or wider than the maximum exposure field size. Namely, the following condition is satisfied:

$$S \leq P \leq R$$

(S: the maximum exposure field size, R: radius of the wafer, P: rib pitch in the radial direction). This condition describes the proper balance of the trade-off matters of the chuck: i.e., an increase in stiffness (the smaller the pitch, the larger the stiffness) versus a reduction in weight (the larger the pitch, the lower the weight).

Since the ribs are formed in the chuck 10 in the side opposite to the holding surface, a deforming neutral axis of the chuck 10 becomes closer to the holding surface. Therefore, deformation in a wafer surface is reduced while allowing the wafer to be reformed.

Figure 14C:
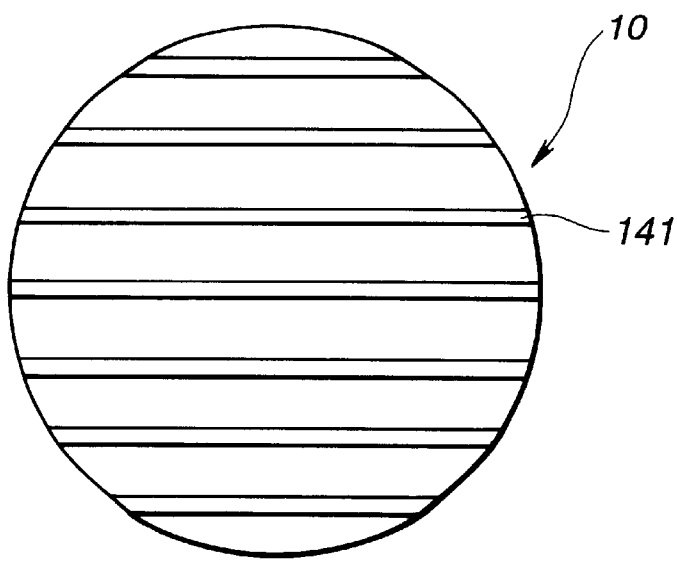
Figure 14C:
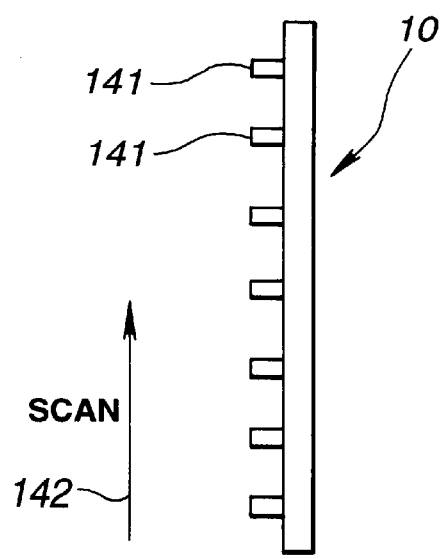
Figure 14C:
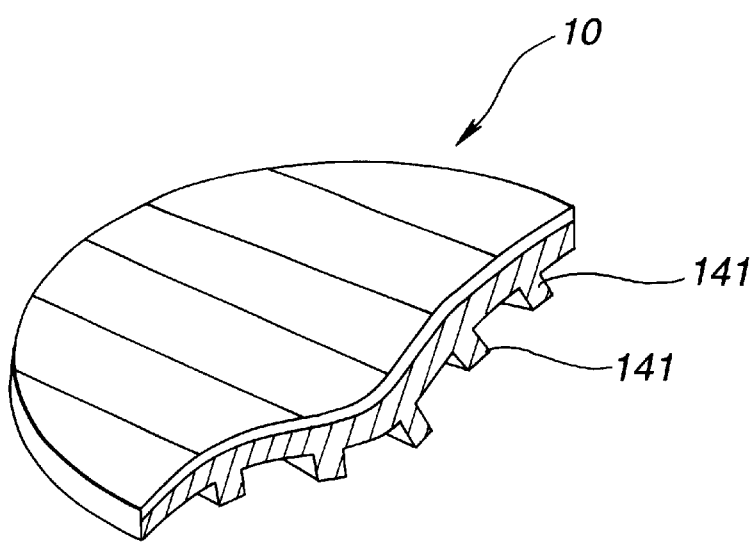

FIGS. 14A through 14C illustrate another modified chuck. A plurality of ribs 141 are formed on the bottom of the chuck 10, parallel to each other in one dimension along a direction perpendicular to the scan exposure direction. An arrow 142 (FIG. 14B) shows the scan exposure direction.

It is important to reduce the weight, especially of the chuck 10 located at the top of the movable portion. The rib-structure is effective to reduce this weight. Although the rib-structure has a high rigidity proximate to each rib, a portion between the ribs 141 lacks relative rigidity. Therefore, the holding surface of the chuck 10 can take on a non-flat form, having a warp along the perpendicular direction in which the ribs are formed, as illustrated in FIG. 14C. If the wafer is held on such a chuck, the held wafer would have a warped shape, resembling the chuck surface.

On the other hand, in a scanning type exposure apparatus, it has been relatively permissible to allow unevenness in height of the wafer in the scan exposure direction rather than in the perpendicular direction. This is because, in the scan exposure apparatus, it is possible to compensate for the wafer unevenness by dynamically adjusting the focus condition of a projection optical system while performing scanning. Conversely, it is difficult to compensate for wafer unevenness in the perpendicular direction of scanning. This could cause image distortion when transferring the mask pattern onto the wafer.

According to the above relation between the direction of formation of the ribs and the scanning direction, the present embodiment forms the ribs along the direction perpendicular to the scanning direction. Therefore, the present embodiment succeeds in reducing chuck weight, while maintaining pattern transferring accuracy.

Figure 15:
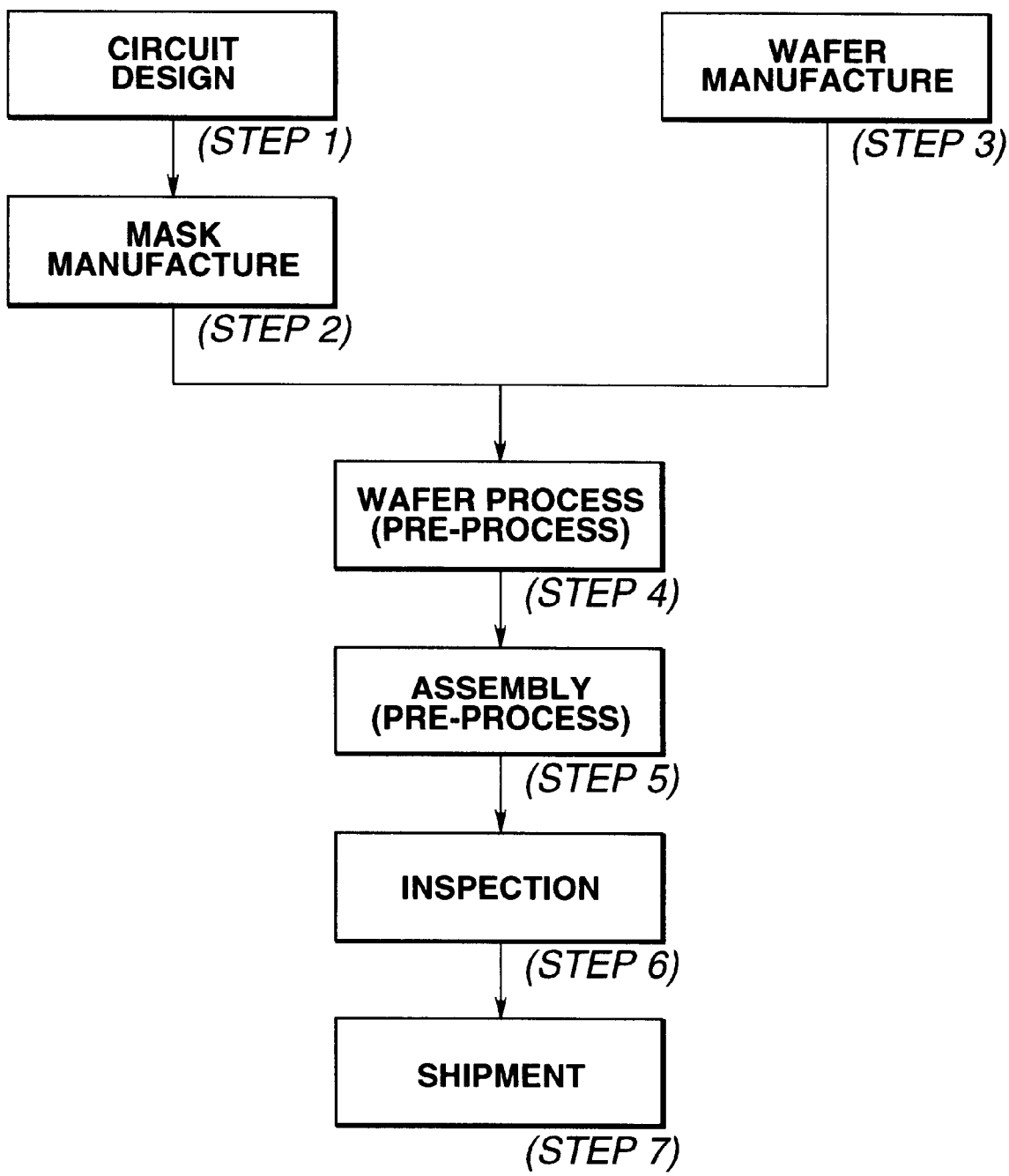
FIG. 15 is a flowchart showing a process for manufacturing a micro-device.

FIG. 15 is a flow chart showing a process for manufacturing a micro-device (e.g., a semiconductor chip such as an IC or an LSI, a liquid crystal panel, a CCD, a thin film magnetic head, a micro-machine or the like). At step 1 (circuit design), the circuit design of the semiconductor device is effected. At step 2 (the manufacturing of a mask), a mask formed with the designed circuit pattern is manufactured. This mask is a reflection type mask and has the above-described features. On the other hand, at step 3 (the manufacturing of a wafer), a wafer is manufactured by the use of a material such as silicon. Step 4 (wafer process) is called a pre-process, in which by the use of the manufactured mask and wafer, an actual circuit is formed on the wafer by the lithography technique. The next step, step 5 (assembling) is called a post-process, which is a process for making the wafer manufactured at step 4 into a semiconductor chip, and includes steps such as an assembling step (dicing and bonding) and a packaging step (enclosing the chip). At step 6 (inspection), inspections such as an operation confirming test and a durability test of the semiconductor device manufactured at step 5 are carried out. Via such steps, the semiconductor device is completed, and it is delivered (step 7).

Figure 16:
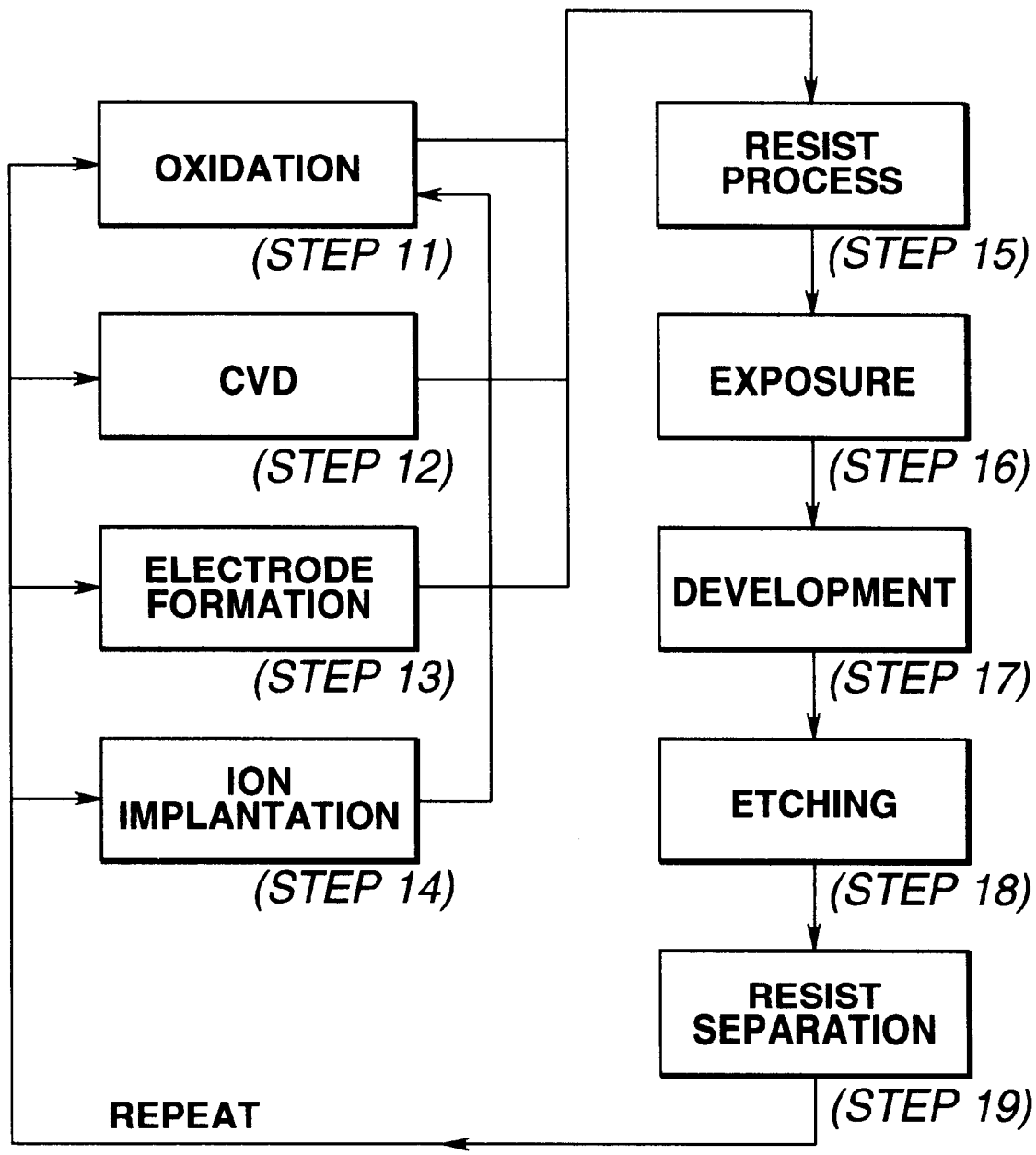
FIG. 16 is a flow chart showing the detailed steps of the wafer process of the micro-device manufacturing process shown in FIG. 15.

FIG. 16 is a flow chart showing the detailed steps of the wafer process discussed above with respect to step 4. At step 11 (oxidation), the surface of the wafer is oxidized. At step 12 (CVD), an insulating film is formed on the surface of the wafer. At step 13 (the forming of an electrode), an electrode is formed on the wafer by vapor deposition. At step 14 (ion implantation), ions are implanted into the wafer. At step 15 (resist processing), a photoresist is applied to the wafer. At step 16 (exposure), the circuit pattern of the mask is printed and exposed onto the wafer by the mask and the exposure apparatus. At step 17 (development), the exposed wafer is developed. At step 18 (etching), the portions other than the developed resist image are scraped off. At step 19 (the peeling-off of the resist), the resist, which has become unnecessary after the etching, is removed. By repetitively carrying out these steps, circuit patterns are multiplexly formed on the wafer. If the manufacturing method of the present embodiment is used, it will be possible to manufacture semiconductor devices having a high degree of integration, which have heretofore been difficult to manufacture.

Except as otherwise disclosed herein, the various components shown in outline or in block form in the figures are individually well known and their internal construction and operation is not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A stage device, comprising:
   a movable body, movable along a guide surface, for moving an element mounted on the movable body;
   a static pressure bearing, having at least one pad, for guiding said movable body along the guide surface, said at least one pad being attached to said movable body at a first position; and
   a linear motor, having a movable part and a relatively stationary part, for moving said movable body, said movable part of said linear motor being attached to said movable body at a second position,
   wherein said movable body has a hollow structure neighboring at least one of the first position and the second position.

2. A stage device according to claim 1, wherein said static pressure bearing supports said movable body on the guide surface in at least one of a vertical direction and a horizontal direction.

3. A stage device according to claim 1, further comprising a damping material, which fills the hollow structure.

4. A stage device according to claim 3, wherein said damping material comprises a material selected from the group consisting of a rubber, a resin, a liquid and a powder.

5. A stage device according to claim 1, wherein the hollow structure is enclosed.

6. A stage device according to claim 5, wherein the enclosed hollow structure has a plurality of compartments.

7. A stage device according to claim 1, wherein the hollow structure has a rib structure.

8. A stage device according to claim 1, further comprising a stationary base, having the guide surface, for supporting said movable body on the guide surface through said static pressure bearing.

9. A stage device according to claim 8, wherein said stationary base has a hollow structure.

10. A stage device according to claim 9, further comprising a damping material, which fills the hollow structure of the stationary base.

11. A stage device according to claim 1, wherein said movable body has a plurality of hollow portions extending along a vertical surface of said movable body.

12. A stage device according to claim 11, wherein the plurality of hollow portions have different hollow sizes.

13. A stage device according to claim 11, further comprising damping material, which fills each of the hollow portions.

14. A stage device according to claim 13, wherein the damping material for each of the hollow portions has a different specific gravity.

15. A stage device according to claim 1, wherein a center of gravity of said movable body of said stage device is at least of a same height as a point on said movable body at which a driving force is applied from said linear motor to said movable body.

16. A stage device according to claim 1, wherein at least a portion of said movable body is made of a ceramic material.

17. A stage device according to claim 1, further comprising a stage top for holding a substrate, said stage top being movable, precisely, in a plurality of directions, wherein the bottom of the stage top has a hollow structure.

* * * * *

UNITED STATES PATENT AND TRADEMARK OFFICE
CERTIFICATE OF CORRECTION

PATENT NO. : 6,266,133 B1
DATED : July 24, 2001
INVENTOR(S) : Yoshikazu Miyajima et al.

It is certified that error appears in the above-identified patent and that said Letters Patent is hereby corrected as shown below:

Column 2,
Line 36 should be deleted; and
Line 37, "to be exposed," should be deleted.

Column 4,
Line 31, "gas tight" should read -- gas-tight --.

Column 6,
Line 58, "control" should read -- control. --.

Signed and Sealed this

Eleventh Day of June, 2002

Attest:

JAMES E. ROGAN
Attesting Officer   Director of the United States Patent and Trademark Office